United States Patent [19]

Garrison

[11] 4,225,378
[45] Sep. 30, 1980

[54] EXTRUSION MOLD AND METHOD FOR GROWING MONOCRYSTALLINE STRUCTURES

[75] Inventor: Lilburn H. Garrison, Vista, Calif.

[73] Assignee: Burroughs Corporation, Detroit, Mich.

[21] Appl. No.: 973,621

[22] Filed: Dec. 27, 1978

[51] Int. Cl.³ .............................................. C30B 15/06
[52] U.S. Cl. ....................................... 156/608; 164/60; 164/82; 164/415; 164/440; 156/617 H; 156/619; 156/DIG. 64; 156/DIG. 73; 156/DIG. 97; 156/DIG. 88; 422/246
[58] Field of Search ........... 156/608, DIG. 64, 617 H, 156/619, 624, 617 SP, DIG. 73, DIG. 89, DIG. 97, DIG. 96, DIG. 88, 622; 422/246, 249; 164/60, 82, 415, 440; 23/301

[56] References Cited

U.S. PATENT DOCUMENTS 2,719,799  10/1955  Christian ........................... 156/617 H

FOREIGN PATENT DOCUMENTS 2085254  12/1971  France ....................................... 164/60
7502202   9/1975  Netherlands ..................... 156/DIG. 96

Primary Examiner—Hiram H. Bernstein
Attorney, Agent, or Firm—Charles. Fassbender; Mervyn L. Young; Kevin R. Peterson

[57] ABSTRACT

An extrusion mold for growing crystalline silicon in any desired size at a very high purity level. The mold is formed of molybdenum with any desired width, length and depth. The major portion of its length is immersed in a temperature-controlled environment. A high temperature receiving end of the mold is located in a controlled atmosphere containing an inert gas such as nitrogen. Molten silicon is poured from a crucible into the open end of the mold in the controlled atmosphere. The extrusion mold is at an incline to permit the molten silicon to flow through the mold until it contacts a seed crystal of silicon. The seed crystal is located at the point where the silicon solidifies. The molten silicon begins to form a crystalline structure oriented according to the seed crystal. As crystallization takes place, the seed is slowly pulled out of the other end of the extrusion mold which is open to the atmosphere bringing the crystalline silicon structure with it.

24 Claims, 3 Drawing Figures

EXTRUSION MOLD AND METHOD FOR GROWING MONOCRYSTALLINE STRUCTURES

BACKGROUND OF THE INVENTION

1. Field of the Invention

The present invention relates to a method and apparatus for growing monocrystalline structures of silicon and like materials from a melt of polycrystalline like material.

2. Description of the Prior Art

In the field of forming monocrystalline structures from a polycrystalline melt of the same material, the Czochralski technique and variations thereof are the most popular. This technique involves the melting of polycrystalline charge such as silicon in a quartz crystal by radio frequency induction heating. Assuming silicon is being processed, the charge is melted at approximately 1420° C. A monocrystalline silicon seed is then lowered into the melt in the crucible while being continually rotated in a clockwise direction. The crucible and its charge is also being rotated in a counterclockwise direction. The seed crystal is slowly withdrawn from the melt until the desired diameter of the pulled monocrystalline structure is obtained. The pull speed is increased to maintain the diameter of the pull desired. This will continue as long as there is melt remaining in the crucible.

Examples of variations on the Czochralski technique can be found in U.S. Pat. Nos. 3,853,489; 3,826,625; 3,759,671; and 3,370,927. U.S. Pat. Nos. 3,759,671 and 3,370,927 do not pull the seed perpendicular to the surface of the melt. The disadvantage of the technique involved in these patents is that the width of the pulled crystal is limited to the width of the surface of the melt and surface tension. The disadvantages of the Czochralski technique generally are that the polysilicon charge is limited in size, the maximum crystal diameter obtainable is six inches, and the oxygen content of the monocrystalline structure pulled from the charge is relatively high due to the use of the quartz crucible.

Another technique used for obtaining monocrystalline material, such as silicon, from a polycrystalline structure is known as float zoning technique. This technique involves the use of a polycrystalline rod of silicon as the charge. This rod is rotated in an inert gas environment in a counterclockwise direction. A monocrystalline seed of silicon is rotated in a clockwise direction. An RF induction heating coil is slowly moved across the length of the polysilicon rod causing it to heat portions of the rod as the coil moves along its length. Initially, a molten button forms on the bottom of the polycrystalline rod. The monocrystalline silicon seed is raised so that its tip is immersed in the molten button of the polycrystalline rod. The RF work coil is engaged to travel upward along the length of the polycrystalline rod at a slow programmed rate causing the molten areas within the rod to pass from one end of the rod to the other. As the molten zone passes through the rotating polysilicon rod, single crystal silicon forms. As each molten portion resolidifies, impurities tend to congregate above the molten zone, thereby leaving the newly formed single crystalline rod to be free of impurities. The advantages to this technique are that extremely low oxygen concentration is experienced in the resulting polycrystalline structure. The disadvantages, however, are that the maximum crystalline diameter attainable is three and one-quarter inches, the cost of a float zone furnace capable of producing this diameter is close to a quarter of a million dollars, and the height of the furnace required is approximately two stories.

Some other techniques that have been employed are exemplified in U.S. Pat. Nos. 3,877,883 and 3,899,304. The U.S. Pat. No. 3,877,883 employs what is generally known as the Bridgeman technique which utilizes a sealed factor that is not capable of producing thin, wide crystals. U.S. Pat. No. 3,899,304 utilizes a technique of a molten material as a support for floating melt thereon. This technique cannot be used to manufacture monocrystalline silicon. A molten support material for a silicon melt is presently not known.

None of these techniques contemplate use of an extrusion mold within a temperature-controlled environment, which permits a monocrystalline body to be formed from a polycrystalline charge in a variety of sizes and shapes as dictated by the size of the charge and the shape and construction of the extrusion mold.

OBJECTS AND SUMMARY OF THE INVENTION

An object of this invention is to provide a method of producing monocrystalline silicon and like material in a variety of shapes and sizes.

Another object of this invention is to provide a method of producing monocrystalline silicon and like material that eliminates the steps of slicing, lapping and polishing, as required by present day processes.

Yet another object of this invention is to provide processing apparatus for manufacturing monocrystalline silicon and like material in a variety of shapes and sizes as directed.

Still another object of this invention is to provide processing apparatus for manufacturing monocrystalline silicon and like material that produces silicon ready for use and does not need to be sliced, lapped and polished.

A further object of this invention is to provide a method and processing apparatus that will produce monocrystalline silicon and the like material in a variety of shapes and sizes in large quantities at a relatively inexpensive rate.

These objects and the general purpose of this invention are accomplished as follows. An enclosed extrusion mold preferably made of molybdenum is placed in a temperature-controlled environment which creates a temperature gradient along its length ranging from about 1410° C. at one end to 600° C. at the other end. The extrusion mold may be made of any material that is non-reactive with silicon. The high temperature end of the extrusion mold is located in a controlled atmosphere enclosure containing an inert gas such as nitrogen, for example at atmospheric pressure. Polycrystalline silicon is heated to its molten state in a crucible located in this controlled atmosphere. The molten silicon is poured into the open end of the extrusion mold located in the atmosphere. A seed crystal fastened to a pull rod or ribbon is located in the extrusion mold at the point that silicon solidifies approximately 1405° C. The seed crystal is inserted from the cool end of the mold which is open to the atmosphere. The extrusion mold is inclined downward slightly at an angle within 0° to 8° to enable the molten silicon to flow through the mold until it contacts the seed crystal. The molten silicon begins to crystallize as it solidifies, forming the single crystal structure dictated by the seed crystal. The seed crystal is slowly pulled out of the extrusion mold from the cool end thereof as the growth from the melt continues. The length and size of the growth is limited by the amount of molten silicon available. The width and thickness of the monocrystalline silicon structure is determined by the mold dimensions.

BRIEF DESCRIPTION OF THE DRAWINGS

Other objects and features of the invention will become apparent to those skilled in the art from consideration of the following specification relating to the annexed drawings in which like reference numerals designate like parts throughout the figures thereof and wherein.

DESCRIPTION OF THE PREFERRED EMBODIMENT

The following description will be in the context of describing the method and apparatus of forming monocrystalline silicon structures from melts of polycrystalline silicon. However, it should be born in mind that the method and apparatus of the present invention may be used with equal effect to provide monocrystalline structures from polycrystalline melts of materials other than silicon, which behave like silicon in the formation of their crystalline structures. For example, germanium or a similar material may also be processed according to the present invention.

Figure 1:
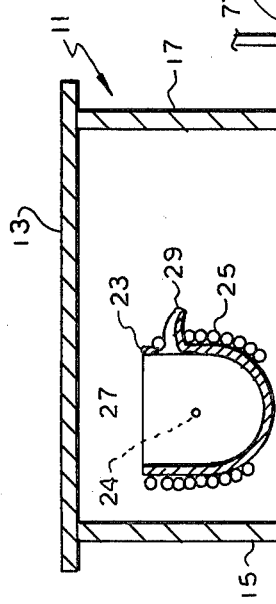
FIG. 1 is a diagrammatic cross-sectional illustration of preferred apparatus utilized to practice the process of the present invention.

The method and apparatus of the present invention is best illustrated in FIG. 1, which discloses an extrusion mold 31 having one end 33 located in a controlled atmosphere 21. The other end 36 is open to the atmosphere. The length of the mold in between is in a controlled temperature environment created by a multi-chamber enclosure 12.

The controlled atmosphere environment 21 is contained within enclosure 11 which has a base 19, sidewalls 15 and 17, and a top 13 which is removable and may be closed to create a hermetically sealed interior. The enclosure 11 can be made of quartz, stainless steel or silicon carbide and other like materials which are non-reactive to molten polycrystalline silicon. The interior atmosphere 21 of the enclosure 11 is made up of an inert gas which is non-reactive with molten silicon, such as nitrogen, argon, helium or hydrogen, for example, and other like gases.

The interior of the enclosure 11 is purged through an exhaust vent 39 which removes the atmosphere 43 therefrom by means of a vacuum-type pump (not shown). The inert gas 45 is then drawn into the interior of the enclosure 11 through opening 41. As will be seen more clearly hereinafter, the extrusion mold 31 is purged of the atmospheric gases contained therein with the inert gas being utilized in enclosure 11 at the same time that the interior of enclosure 11 is purged. The flow of gas 45 in the enclosure 11 is controlled so that the pressure within enclosure 11 is approximately at atmospheric pressure.

Located within enclosure 11 is a crucible 23 of desired size, which has a pouring spout 29 therein. It is mounted to be tipped for the purpose of pouring the molten contents 27 within it into the receiving end 33 of extrusion mold 31. The tipping of the crucible 23 is accomplished by suitable means 24 (not shown) which is well known in the art as comprising hand-operated or mechanically controlled servo-operated tilting mechanisms.

The crucible 23 is preferably made of silicon carbide coated graphite which is heated by means of an RF induction heating coil 25 to cause the solid polycrystalline silicon contained within it to melt and be maintained at a temperature of approximately 1415° C. RF induction heating mechanisms are well known and will not be further described.

The extrusion mold 31 can be any basic shape and size desired, depending on the application of the monocrystalline silicon material. For example, the present process and apparatus is capable of producing slabs of monocrystalline silicon that could be used in the manufacture of large solar cells six feet in length. The preferred configuration for the extrusion mold 31 for such application is rectangular in cross-section, having a length of six feet and a thickness of 50 mils. The width could be any that is desired.

The extrusion mold is preferably made of molybdenum. It is entirely enclosed, except for the melt receiving end 33, and the monocrystalline silicon pulling end 37. The internal surfaces of the molybdenum mold 31 is coated with a polished silicon carbide layer to prevent the molten polycrystalline silicon and solidified monocrystalline silicon from reacting or sticking to the walls of the mold.

Figure 2:
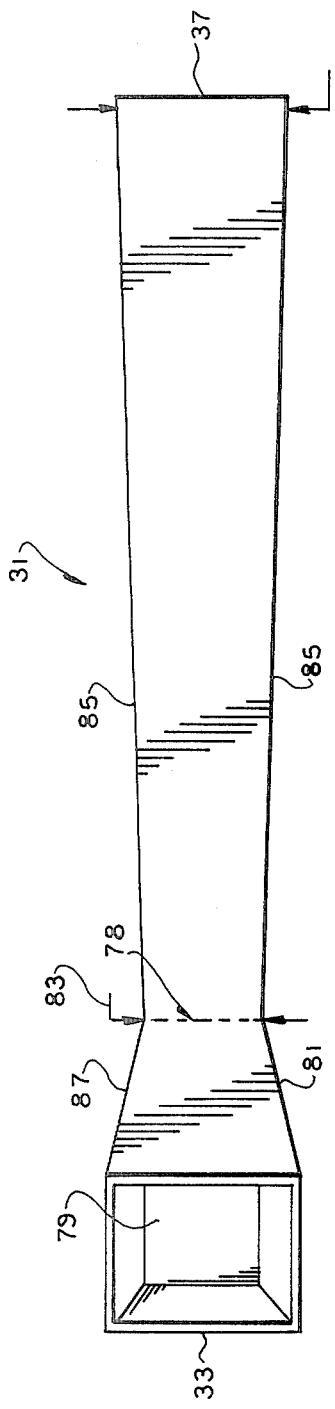
FIG. 2 is a top view of a preferred structure for the extrusion mold utilized in the apparatus of FIG. 1.

Rather than having a uniform rectangular cross section throughout, the extrusion mold 31 may have the lines shown in FIG. 2. The sides 85 of the extrusion mold 31 rather than being straight taper in from the melt receiving inlet 79, in the direction indicated at 81 to a distance which would provide the width 83 desired for the monocrystalline silicon. The sides of the mold taper 81 to the minimum point 78 which occurs exactly at the solidifying temperature of the temperature environment within which the extrusion mold is located. From that point 78 onward the side 85 taper back out to a width 87 at the end 37, which is the same as the width of the extrusion mold 31 at the melt receiving end 33. By tapering the sides of the extrusion mold 31 in this manner, the width of the monosilicon slab is exactly controlled and any sticking that may occur in a straight-sided extrusion mold is prevented.

The controlled temperature enclosure 12 within which the major portion of the extrusion mold is located, consists of a polarity of separate temperature controlled chambers 47, 49, 51, 53, 57 and 59. The enclosure 12 is perfectly made up so that the base 61, the top 63, and the sides (not shown) and the partitions 65 of the enclosure 12 are all constructed of molybdenum.

The preferred construction of the temperature controlled enclosure 12 is a seven-chamber enclosure, wherein the first six chambers 47, 49, 51, 53 and 57 contain salt solutions 69 which are heated by automatic heating devices 77. Automatic heating devices 77 are well known immersion heating devices that circulate as well as heat the solution in which it is immersed. Devices 77 include a thermocoupler or other temperature sensing means which feeds its signal back to control circuitry (not shown) that increases and decreases the energy supplied to the heating elements of the immersion heaters 77 to maintain the salt solution 69 at the desired temperature. The following temperatures are preferred when processing polycrystalline silicon.

The temperature at the first chamber 47 is maintained at 1410° C. The temperature at the second chamber 49 is maintained at 1406° C. The temperature at the third chamber 51 is maintained at 1405° C. The temperature at the fourth chamber 53 is maintained at 1375° C. The temperature at the fifth chamber 55 is maintained at 1275° C. The temperature at the sixth chamber 57 is maintained at 1100° C. The molybdenum extrusion mold 31 has electrical heating elements 35 embedded in its receiving end 33 to maintain the receiving end 33 at a temperature of 1410° C.

The last chamber 59 of the temperature-controlled enclosure 12 is a cooling chamber for the purpose of removing heat from the monocrystalline silicon material within the extrusion mold 31 prior to its emergence at end 37 into the atmosphere. Chamber 59 preferably may contain antifreeze fluid 71 which absorbs the heat emanating from the extrusion mold section contained within the chamber and carries it to a typical radiating device due to the continual flow of the hot fluid 75 to the radiator and the cool fluid 73 into the chamber 59. The type of cooling fluid utilized the velocity of the flow and size of the radiator will be determined by the amount of heat to be dissipated by chamber 59. It is preferred that chamber 59 dissipate 500° C. so that the monocrystalline structure emanating from end 37 into the atmosphere is approximately 600° C.

The size of each of the chambers 47 through 57 will depend upon the rate of pull of the monocrystalline body and the size (length, width, thickness) of the extrusion die, which determines the size of the polycrystalline melt and the monocrystalline body within the extrusion mold. These factors determine the heating and cooling required along the length of the extrusion die to provide the preferred temperature profile. The determination of the size of each chamber required for the parameters as stated above is well within the purview of a person with ordinary skill in the art and will not be further discussed herein.

Extrusion die 31 extends through the partitions 65 of the various chambers and the temperature controlled enclosure as well as the side wall 17 of the atmosphere controlled enclosure 11. The points 67 at which the extrusion die extends through the partitions 65 are sealed so that each chamber 47, 49, 51, 53, 55, 57, 59, etc. is a separate fluid unit. The extrusion die 31 is supported by the partitions 65 as well as by other support means (not shown) in a well known manner to lie at a downhill slope which is preferably at an angle within the range 0°-8° from its horizontal. In FIG. 1, the horizontal of the extrusion die 31 is a plane parallel to the plane on which the atmosphere enclosure 11 and temperature enclosure 12 sit. Alternatively, the extrusion mold 31 could be built so that it is not at a slope with respect to its horizontal, but rather the entire assembly of atmosphere enclosure 11 and temperature enclosure 12 with the extrusion mold therein could be placed in a support that is shaped at an angle from 0°-8° from the ground plane. The atmosphere end 37 of the extrusion mold 31 is always lower than its hot end 33.

The partition between chamber 49 and 51 at point 78 of the extrusion die is at the solidifying temperature of polycrystalline silicon, that is 1405°±½° C. A seed crystal 89 which is fastened to a pulling rod or web 93 by way of a graphite chuck 91 through set screws 95 and 97 are inserted into the extrusion mold 31 from the atmosphere end 37 to the point 78 at which the molten polycrystalline silicon begins to solidify. The seed crystal is fastened through the pulling rod 93 to a pull motor (not shown) of a standard screwdrive or pneumatic type that upon actuation pulls the seed crystal of the extrusion mold at a programmed rate which is preferably ⅛ to ½ inches per minute. The rate of the pull depends upon the size of the monocrystalline silicon body desired.

Figure 3:
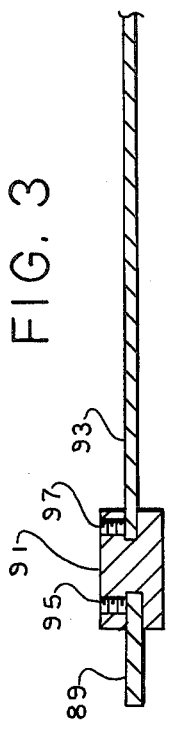
FIG. 3 is a side cross-sectional view of a seed, a seed chuck and a pulling rod mechanism which may be utilized in practicing the process of the present invention.

The process, according to the present invention, is performed by the apparatus of FIGS. 1, 2 and 3, as follows.

The seed crystal 89 is inserted into the extrusion mold 31 until its tip reaches the point 78 of the mold which point will be at the solidifying temperature of the molten polycrystalline silicon or other polycrystalline material utilized. The temperature chambers 47, 49, 51, 53, 55, 57 and 59 are then turned on to provide the desired temperature gradient across the length of the extrusion mold. The solid polycrystalline material in the crucible 23 is then heated to its molten state, in an inert atmosphere 21, such as nitrogen within atmospheric chamber 11. Upon reaching its molten state at 1410° C.-1420° C., the molten polycrystalline melt is poured into the open end 33 of the extrusion mold 31 by well known controlled pouring means.

The extrusion mold 31, as discussed above, is placed at a down hill slope from its horizontal causing the molten silicon to run down the incline into the extrusion mold 31 until the seed crystal 89 is contacted at point 78 of the mold. At this point, the temperature of the mold is at 1405°±½° C., causing the melt to begin to solidify according to the dictates of the seed crystal utilized, which may have a 111, 110 or 100 orientation.

The pulling mechanism (not shown) to which the pull rod 93 is attached is engaged to slowly pull the seed crystal out of the extrusion mold 31. As the seed crystal is pulled out of the extrusion mold, monocrystalline silicon is formed in the mold starting at point 78 and continues to grow as long as polycrystalline melt is supplied at the input end 33 of the extrusion mold 31. The monocrystalline silicon being formed around point 78 in the extrusion mold is gradually cooled in a controlled manner from point 78 to the exit end 37 of the extrusion mold. When the monocrystalline silicon emerges from the extrusion mold 37 into atmospheric temperature and pressure, it is continued to be pulled out of the mold until the desired length is obtained, or the melt in the crucible is totally used up.

For large slabs of monocrystalline silicon, conveyor rollers may be set up to receive the monocrystalline slab as it exits the atmospheric end 37 of the extrusion mold 31. The monocrystalline slab which is at 600° C. is then allowed to cool to room temperature. The slab is the desired shape and size as determined by the extrusion mold and the size of the polycrystalline change.

What has been described is a method and apparatus for producing single monocrystalline silicon or like materials that produces a variety of shapes and sizes of monocrystalline silicon ready for use.

What is claimed is:

1. A method of growing a monocrystalline body from a polycrystalline melt of the same material, the steps of said method comprising:
   placing a seed crystal attached to a pull rod or web inside an enclosed extrusion mold made of material that is non-reactive to said melt from an end of said mold exposed to the atmosphere;

maintaining a fixed temperature gradient along the length of the mold from one end to the other which gradually decreases from a temperature slightly lower than the melt, but still above its melting point at one end to a temperature at the other end that would decrease the temperature of the exiting monocrystalline body sufficiently to expose it to the atmosphere, the seed crystal being located at the temperature within the mold at which said melt solidifies; and pouring the polycrystalline melt into the open hot end of said enclosed extrusion mold, said extrusion mold being at a slight downhill angle from its hot to its cool end; and forming said monocrystalline body by pulling the seed crystal out of said extrusion mold and into the atmosphere.

2. The method of claim 1 wherein said material utilized is silicon.

3. The method of claim 2 wherein the seed crystal is a monocrystalline silicon rod having any one of the desired crystal lattice orientations such as $<111>$, $<110>$ or $<100>$.

4. The method of claim 2 wherein the extrusion mold has its hot open end located in a controlled atmosphere of inert gas such as nitrogen, argon, helium or hydrogen.

5. The method of claim 4 wherein the hot end of the extrusion mold is maintained at approximately 1410° C.

6. The method of claim 5 wherein the cool end of the extrusion mold is located in a refrigeration unit for removing heat from that end of the extrusion mold.

7. The method of claim 6 wherein the temperature of the monocrystalline silicon body leaving the cool end of the extrusion mold is approximately 600° C.

8. The method of claim 2 wherein said maintaining step comprises reducing the temperature of the polycrystalline silicon melt and the subsequently formed monocrystalline silicon body according to stages wherein the first stage would maintain the melt at approximately 1410° C., the second stage would maintain the melt at approximately 1406° C., the third stage would maintain the solidifying monocrystalline silicon body at approximately 1405° C., the fourth stage would maintain the monocrystalline silicon body at approximately 1375° C., the fifth stage would maintain the monocrystalline silicon body at approximately 1275° C., the sixth stage would maintain the monocrystalline silicon body at approximately 1100° C., the seventh stage would maintain the monocrystalline silicon body at approximately 600° C.

9. The method of claim 8 wherein the said melt is at approximately 1415° C.

10. Apparatus for growing a monocrystalline body from a polycrystalline melt of the same material, said apparatus comprising:

an enclosed extrusion mold open at both ends thereof, the first end adapted for receiving a melt, the second adapted for removal of the monocrystalline body therefrom, the mold being on an incline with its first end higher than its second end;

a controlled atmosphere enclosure, the first end of said extrusion mold being located therein;

a crucible adapted for holding said melt located in said controlled atmosphere enclosure so as to pour its molten contents at a controlled rate into the first end of said extrusion mold; and a controlled-temperature enclosure means completely surrounding said extrusion mold from the point it exits the controlled atmosphere enclosure to the second end thereof for maintaining a fixed temperature gradient along the length of the mold from one end to the other.

11. The apparatus of claim 10 wherein the second end of said extrusion mold is exposed to the atmosphere.

12. The apparatus of claim 11 further comprising a seed crystal and pulling attachment inserted into said extrusion mold from the second end thereof to the point therein at which the melt begins to solidify.

13. The apparatus of claim 10 wherein said extrusion mold comprises an outer shell of molybdenum coated internally with a polished layer of silicon carbide.

14. The apparatus of claim 13 wherein said extrusion mold is approximately six feet long.

15. The apparatus of claim 10 wherein the controlled atmosphere enclosure means is constructed from any one of the following materials, quartz, stainless steel or silicon carbide, and is capable of being hermetically sealed.

16. The apparatus of claim 15 wherein said enclosure contains an inert gas in regard to said melt.

17. The apparatus of claim 16 wherein said inert gas is any one of the following gases, nitrogen, argon, helium or hydrogen.

18. The apparatus of claim 17 wherein said gas is kept at about atmospheric pressure within said controlled atmosphere enclosure.

19. The apparatus of claim 10 wherein said crucible is a carbide-coated graphite container that is heated by radio frequency induction heating means.

20. The apparatus of claim 19 wherein said crucible is mounted for pouring its contents at a controlled rate into the first end of said extrusion mold so that the falling distance of the melt is approximately two inches.

21. The apparatus of claim 10 wherein the controlled-temperature enclosure means comprises a plurality of separate adjacent chambers constructed of molybdenum, a portion of said extrusion mold passing through each one.

22. The apparatus of claim 21 wherein all but the last of said plurality of chambers contain heating and circulating means for maintaining salt solutions contained within each chamber at a desired temperature.

23. The apparatus of claim 22 wherein the last of said chambers contains heat dissipating fluid for reducing the temperature of the monocrystalline body contained within the extrusion mold to a temperature suitable for exposing the monocrystalline body to the atmosphere.

24. The apparatus of claim 10 wherein said enclosed extrusion mold is generally flat with a rectangular cross section, the width of the mold being constant except for a distance along its length that tapers inward to a width desired for the monocrystalline body and then back out to the width of the mold at its second end.

* * * * *